(12) United States Patent
Uzan et al.

(10) Patent No.: US 10,700,677 B2
(45) Date of Patent: Jun. 30, 2020

(54) METHOD AND DEVICE FOR OPERATING A SWITCHING ELEMENT

(71) Applicant: Robert Bosch GmbH, Stuttgart (DE)

(72) Inventors: Tankut Uzan, Tamm (DE); Martin Kessler, Schwaebisch Gmuend (DE); Peter Sinn, Untergruppenbach (DE)

(73) Assignee: Robert Bosch GmbH, Stuttgart (DE)

( * ) Notice: Subject to any disclaimer, the term of this patent is extended or adjusted under 35 U.S.C. 154(b) by 220 days.

(21) Appl. No.: 15/534,561

(22) PCT Filed: Oct. 9, 2015

(86) PCT No.: PCT/EP2015/073346
§ 371 (c)(1),
(2) Date: Jun. 9, 2017

(87) PCT Pub. No.: WO2016/091429
PCT Pub. Date: Jun. 16, 2016

(65) Prior Publication Data
US 2017/0331470 A1 Nov. 16, 2017

(30) Foreign Application Priority Data

Dec. 12, 2014 (DE) .................. 10 2014 225 755

(51) Int. Cl.
*H03K 17/0812* (2006.01)
*H02H 9/04* (2006.01)
(Continued)

(52) U.S. Cl.
CPC ....... *H03K 17/08128* (2013.01); *H02H 9/045* (2013.01); *H03K 17/082* (2013.01);
(Continued)

(58) Field of Classification Search
CPC .......... H03K 17/08128; H03K 17/082; H03K 17/10; H03K 17/14; H03K 2017/0806; H02H 9/045
(Continued)

(56) References Cited

U.S. PATENT DOCUMENTS

2001/0002782 A1 6/2001 Shimane et al.
2009/0072770 A1* 3/2009 Son .......................... B60L 3/06
318/139
(Continued)

FOREIGN PATENT DOCUMENTS

CN 101656528 A 2/2010
CN 102904555 A 1/2013
(Continued)

OTHER PUBLICATIONS

International Search Report for Application No. PCT/EP2015/073346 dated Jan. 20, 2016 (English Translation, 2 pages).

*Primary Examiner* — Thienvu V Tran
*Assistant Examiner* — Nicolas Bellido
(74) *Attorney, Agent, or Firm* — Michael Best & Friedrich LLP

(57) ABSTRACT

The invention relates to a method (10) and to a device (ALE) for operating a switching element (LHS), said method comprising the following steps: a temperature (Tmp) of the switching element (LHS) is determined (22) and said switching element (LHS) is operated (26) in accordance with the determined temperature (TmP).

6 Claims, 1 Drawing Sheet

(51) Int. Cl.
  *H03K 17/08* (2006.01)
  *H03K 17/082* (2006.01)
  *H03K 17/10* (2006.01)
  *H03K 17/14* (2006.01)

(52) U.S. Cl.
  CPC ............ *H03K 17/10* (2013.01); *H03K 17/14* (2013.01); *H03K 2017/0806* (2013.01)

(58) Field of Classification Search
  USPC ....................................................... 361/91.1
  See application file for complete search history.

(56) References Cited

U.S. PATENT DOCUMENTS

| | | | |
|---|---|---|---|
| 2010/0046123 A1* | 2/2010 | Fukami | H03K 17/0822 361/18 |
| 2010/0265064 A1* | 10/2010 | Mayer | H05B 45/00 340/541 |
| 2012/0242376 A1 | 9/2012 | Ose et al. | |
| 2013/0027830 A1* | 1/2013 | Illing | H02H 7/222 361/103 |

FOREIGN PATENT DOCUMENTS

| | | |
|---|---|---|
| DE | 102006017243 | 11/2007 |
| DE | 102013212262 | 1/2014 |
| JP | 2013141409 | 7/2013 |
| WO | 2010067193 A1 | 6/2010 |

* cited by examiner

METHOD AND DEVICE FOR OPERATING A SWITCHING ELEMENT

BACKGROUND OF THE INVENTION

The invention relates to a method and a device for operating a switching element. The invention further relates to an electrical system comprising the device, to a computer program for carrying out said method and also to a machine-readable storage medium.

Switching elements, in particular power semiconductor switches, possess a temperature-dependent dielectric strength. In this context, dielectric strength means the ability of a switching element to isolate a voltage applied to the two poles of the switching element in the open state permanently and reliably from one another. At relatively low temperatures, the dielectric strength of a switching element is 600 V, for example. This means that the switching element is designed in such a way that it permanently isolates a voltage of 600 V applied to the poles thereof. At relatively high temperatures, the same switching element is able to isolate voltages of approximately 750 volts from one another. An increase in the dielectric strength of switching elements can be observed within certain limits. For the operation of robust electronic circuits, there is provision for only that voltage that can be reliably isolated by the switching element at the lowest operating temperatures of the circuit to be permitted as the maximum voltage at the poles of the switching element. The potential of the switching elements is therefore not utilized at relatively high operating temperatures, at which even a relatively high voltage at the poles of the switching element would be able to be reliably isolated, and therefore a relatively high power would be able to be switched.

It is accordingly known practice from the prior art, for example from DE 10 2006 047 243 A1, to operate a motor vehicle on-board electrical system using a power transistor, wherein the electrical circuit is configured in such a way that voltages that would exceed the dielectric strength of the transistor are not able to occur.

There is the need to develop alternatives to this that make it possible to utilize the relatively high dielectric strength of switching elements at relatively high temperatures.

SUMMARY OF THE INVENTION

A method for operating a switching element is provided, said method having the following steps:

determining a temperature of the switching element and operating the switching element depending on the determined temperature.

A method that is used to operate a switching element depending on a determined temperature is therefore provided. It is therefore advantageously possible to operate the switching element in a manner optimized for the present temperature. In particular, it is possible to operate the circuit at the present temperature using the maximum powers that are then possible.

The switching elements may be embodied as power semiconductor switches, for example, in particular said switching elements may have field-effect transistors such as MOSFETs or insulated-gate bipolar transistors (IGBTs). When determining the temperature, all customary methods of determining the temperature of a switching element are conceivable. In particular, a temperature sensor in proximity to the power semiconductor switch itself may be provided to determine the most accurate temperature of the power semiconductor switch.

In another configuration of the invention, the method has the following further step:

determining a permissible load current through the switching element depending on the determined temperature, wherein the switching element is operated using a load current that is not greater than the permissible load current.

A permissible load current is determined depending on the determined temperature. A permissible load current can be determined, for example, by reading a family of characteristics. For this purpose, the family of characteristics contains data that can be extracted, for example, from tables or characteristic curves relating to the dielectric strength of the switching elements at different temperatures. The switching element is then operated using a load current that is smaller than the permissible load current. For this purpose, the load current to be switched is limited, for example by means of software or a hardware circuit, in such a way that it does not exceed or overshoot the permissible load current. Opening and closing the switching elements give rise to overvoltages on the switching elements. The greater the currents that are switched by means of the switching elements, the greater said overvoltages. In order to avoid excessive overvoltages at the switching elements, which would lead to destruction of the switching elements on account of the limited dielectric strength of the switching elements, the load current is limited by the switching elements in such a way that said load current is always lower than the determined load current. Therefore, overvoltages that would lead to destruction of the switching elements cannot occur during operation of the switching elements.

A method for operating a switching element is therefore advantageously provided, in which reliable operation of the switching element with maximum utilization of the switchable power depending on the temperature is made possible.

In another configuration of the invention, the method has the following further steps: comparing the determined temperature with a temperature threshold value, heating the switching element as long as the determined temperature is lower than the temperature threshold value.

This means that the temperature is compared with a temperature threshold value. It is therefore ascertained whether the temperature of the switching element is lower than a predefinable temperature threshold value. In this case, the temperature threshold value can be predefined in such a way that it corresponds to a temperature at which the switching element has a maximum or a desired dielectric strength. As long as the temperature is lower than the predefinable temperature threshold value, the dielectric strength is also lower than the maximum dielectric strength of the switching element. In order that the maximum power can be switched during switching, it is necessary for the switching element to have a temperature that is not lower than the temperature threshold value. The switching element is therefore heated until the temperature of the switching element has reached the temperature threshold value.

A method that makes it possible for the switching element to be able to be used for switching the maximum power as quickly as possible, by virtue of said switching element being actively heated until the switching element has a desired temperature, is therefore advantageously provided.

In another configuration of the invention, the switching element is heated by means of a predefinable load current through the switching element. There are several conceivable possibilities for heating the switching element. Heating the switching element by means of a predefinable load current through the switching element is a particularly advantageous variant as no additional components are required. In this case, the load current can be predefined in such a way that the switching element is heated but without damaging the switching element. Alternatively, heating by means of a heating coil or other variants is also conceivable, where the switching element is heated indirectly by means of heat transfer.

In another configuration of the invention, when the determined temperature of the switching element is greater than the temperature threshold value or corresponds thereto, the switching element is operated using a load current that is not greater than a predefined maximum load current. This means that the switching element can be used to switch the maximum power. The switching element can be operated using a load current that corresponds to the maximum load current when the temperature of the switching element is not lower than the temperature threshold value. For this purpose, the load current to be switched is limited, for example by means of software or a hardware circuit, in such a way that it does not exceed or overshoot the maximum load current. The maximum load current of a switching element can be predefined for this purpose depending on the maximum dielectric strength of the switching element.

A method that makes it possible to use a switching element for switching the maximum power is therefore advantageously provided.

In another configuration of the invention, the method also has the further step of providing an overvoltage network, which is designed for a voltage potential that arises at the predefined maximum load current.

During operation of switching elements in relatively large electrical networks, overvoltages occur in the electrical system when high-power loads are switched on and off. It is therefore customary to provide overvoltage networks that minimize the voltage fluctuations and therefore reduce the maximum voltage in the electrical system to such an extent that the voltages arising on the switching elements are lower than the maximum permissible voltages on account of the dielectric strength thereof. Said overvoltage networks are usually designed taking into account the dielectric strength at low temperatures of the switches. In accordance with this configuration of the invention, the overvoltage network is designed taking into account the dielectric strength at a temperature that corresponds to the temperature threshold value.

The switching of the maximum power is therefore advantageously made possible using the switching element.

Furthermore, a device for operating a switching element is provided, which device is configured to perform one of the described methods. Said device is, in particular, a device that comprises an actuation logic unit, for example. The temperature of a switching element is detected by means of a temperature sensor. Said temperature can be compared with a temperature threshold value by means of a comparator. The actuation logic unit can determine a permissible load current depending on the temperature. The actuation logic unit operates the switching element. The switching element can be operated, in particular, in such a way that the load current through the switching element is not greater than a permissible load current or a maximum load current.

A device that makes it possible to operate a switching element using a maximum switchable load is therefore advantageously provided.

Furthermore, an electrical system that comprises a described device and at least one switching element for switching a load current within a vehicle is provided. A system that makes it possible to reliably operate switching elements within a vehicle is therefore advantageously provided.

Furthermore, a computer program that is configured to perform all the steps of one of the cited methods is provided.

Furthermore, a machine-readable storage medium, on which the described computer program is stored, is provided.

It is self-evident that the features, properties and advantages of the method according to the invention accordingly pertain to and are applicable to the device according to the invention and to the electrical system and vice versa.

Further features and advantages of embodiments of the invention emerge from the below description in relation to the appended drawings.

BRIEF DESCRIPTION OF THE DRAWINGS

The invention will be described in more detail below with reference to a few figures, in which.

DETAILED DESCRIPTION

Figure 1:
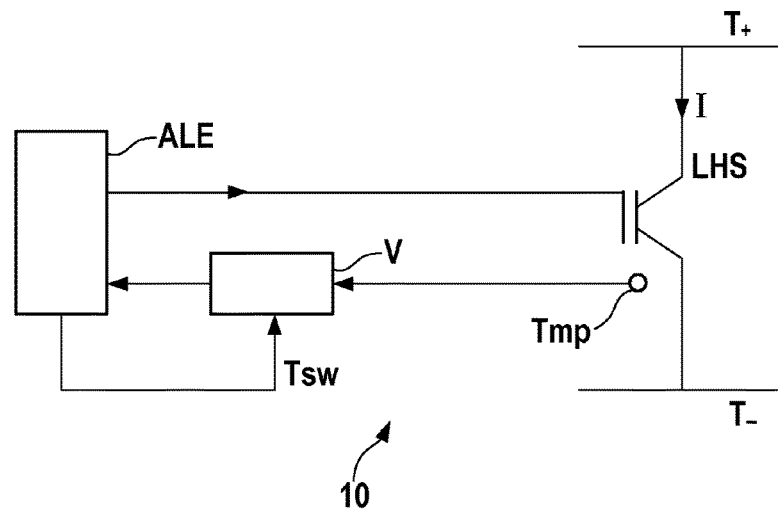
FIG. 1 shows a schematic illustration of an electrical system.

FIG. 1 shows a schematic illustration of an electrical system. The electrical system 10 comprises at least one switching element LHS, in particular a power semiconductor switch, which conducts a current I from the potential T+ to the potential T− in the closed state, and an actuation logic unit ALE for actuating the switching element LHS. A temperature sensor is provided to determine the temperature Tmp. The actuation logic unit ALE actuates the switching element depending on the determined temperature Tmp. Furthermore, a comparator unit V for comparing the determined temperature Tmp with a predefinable temperature threshold value Tsw is illustrated. The comparator V is connected to the actuation logic unit ALE. The actuation logic unit ALE can determine a permissible load current Iz depending on the determined temperature Tmp. The temperature Tmp can be supplied, as illustrated, to the actuation logic unit ALE by means of the comparator V, or else can be read in directly by the actuation logic unit ALE.

Figure 2:
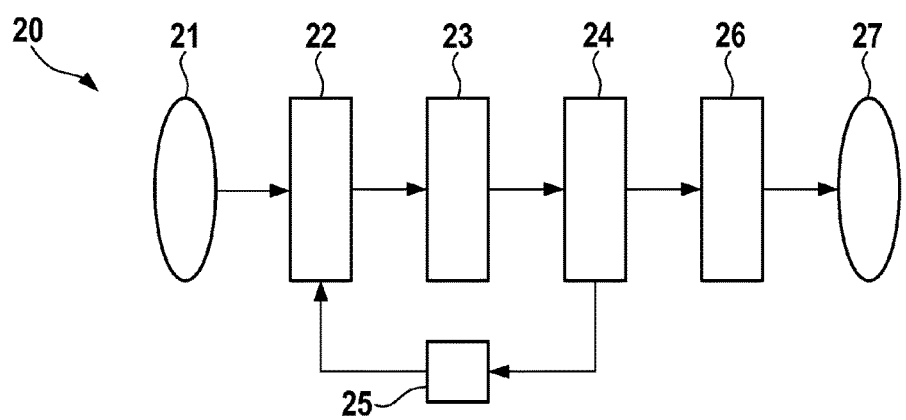
FIG. 2 shows a method for operating a switching element.

FIG. 2 shows a method 20 for operating a switching element LHS. The method begins with step 21. In step 22, a temperature Tmp of the switching element LHS is determined. In step 23, a permissible load current Iz through the switching element LHS can be determined depending on the determined temperature Tmp. In step 24, the determined temperature Tmp can be compared with a temperature threshold value Tsw. As long as the determined temperature Tmp is lower than the temperature threshold value Tsw, the method can branch off to step 25. In step 25, the switching element LHS is heated. Said heating can take place, in particular, by means of operating the switching element LHS using a low load current I. The method branches off from step 25 back to step 22, where the temperature Tmp is determined again. In step 26, the switching element LHS is operated depending on the temperature Tmp. In this case, the load current I through the switching element LHS is, in particular, not greater than the permissible load current Iz or, if the determined temperature Tmp is greater than the temperature threshold value Tsw, the load current I through the switching element LHS is not greater than the maximum load current Imax. The method ends with step 27.

The invention claimed is:

1. A method (20) for operating a switching element (LHS), comprising the following steps:
   determining (22) a temperature (Tmp) of the switching element (LHS),
   operating (26) the switching element (LHS) depending on the determined temperature (Tmp),
   determining (23) a permissible load current (Iz) through the switching element (LHS) depending on the determined temperature (Tmp), wherein the switching element (LHS) is operated using a load current (I) that is not greater than the permissible load current (Iz), the load current (I) being a current for purposefully heating the switching element (LHS),
   comparing (24) the determined temperature (Tmp) with a temperature threshold value (Tsw),
   heating (25), by applying a predefinable load current (Iv), the switching element (LHS) when the determined temperature (Tmp) is lower than the temperature threshold value (Tsw), and
   stop heating, by applying the predefinable load current (Iv), the switching element (LHS) when the determined temperature (Tmp) exceeds the temperature threshold value (Tsw).

2. The method as claimed in claim 1, comprising the further step of:
   when the determined temperature (Tmp) is exceeds the temperature threshold value (Tsw), operating (26) the switching element (LHS) using a load current (I) that is not greater than a predefined maximum load current (Imax).

3. The method as claimed in claim 2, comprising the further step of: providing an overvoltage protection via an actuation logic unit, the actuation logic unit configured, to limit a voltage potential that arises at the predefined maximum load current (Imax).

4. A device (ALE) for operating a switching element, which device is configured to perform the method (20) as claimed in claim 1.

5. An electrical system (10), comprising a device (ALE) as claimed in claim 4 and at least one switching element (LHS) for switching a load current (I) within a vehicle.

6. A non-transitory computer readable medium containing a computer program, configured to perform all the steps of the method (20) as claimed in claim 1.

* * * * *